(12) United States Patent
Ikegami

(10) Patent No.: US 7,826,186 B2
(45) Date of Patent: Nov. 2, 2010

(54) SEMICONDUCTOR DEVICE HAVING AN ESD PROTECTION CIRCUIT

(75) Inventor: Masakazu Ikegami, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 404 days.

(21) Appl. No.: 12/076,325

(22) Filed: Mar. 17, 2008

(65) Prior Publication Data
US 2008/0232009 A1 Sep. 25, 2008

(30) Foreign Application Priority Data
Mar. 19, 2007 (JP) ............... 2007-070133

(51) Int. Cl.
H02H 9/00 (2006.01)
(52) U.S. Cl. ........................................ 361/56
(58) Field of Classification Search ......... 331/116–117; 361/56–58, 111
See application file for complete search history.

(56) References Cited
U.S. PATENT DOCUMENTS
5,579,200 A * 11/1996 Rajkanan et al. ............ 361/111

6,650,164 B2 * 11/2003 Kondo ........................ 327/309

FOREIGN PATENT DOCUMENTS
JP 2003-133855 5/2003

* cited by examiner

Primary Examiner—Stephen W Jackson
Assistant Examiner—Angela Brooks
(74) Attorney, Agent, or Firm—McGinn IP Law Group, PLLC

(57) ABSTRACT

When a manufacturing process becomes finer and a threshold value drops, a leakage current generates in a MOS transistor that is normally in an off-state. In order to suppress an influence of a leakage current that is generated in a protection transistor that constitutes a protection circuit on the internal circuit, an adjustor circuit that forms a transit path of the leakage current is disposed within the protection circuit, and a monitor circuit having the same circuit configuration as a configuration of the protection circuit is disposed to control an impedance of the transit path in the protection circuit and the monitor circuit so as to allow the leakage current to flow through the transit path.

11 Claims, 7 Drawing Sheets

SEMICONDUCTOR DEVICE HAVING AN ESD PROTECTION CIRCUIT

BACKGROUND OF THE INVENTION

1. Field of the Invention

The present invention relates to a semiconductor device, and more particularly, to a semiconductor device having an ESD protection circuit.

2. Description of the Related Art

Generally, an oscillator circuit used in electronic equipment or the like is formed on a semiconductor substrate and connected to the semiconductor substrate through a crystal oscillator disposed at another location and through an input/output terminal. In such a case, there is a fear in that a main circuit portion of the oscillator circuit is destroyed due to a surge voltage that invades the oscillator circuit from an external through the input/output terminal. Accordingly, in order to protect the main circuit portion of the oscillator circuit from the electrostatic discharge (ESD), an electrostatic protection circuit is disposed at the input/output terminal side.

FIG. 6 shows an example of the oscillator circuit. An oscillator circuit 10 includes an input terminal 1 and an output terminal 2 which are disposed on a semiconductor integrated circuit chip, an electrostatic protection circuit (hereinafter referred to as "ESD protection circuit") 3, a CMOS inverter 4 having an input end that is high in impedance, a feedback resistor R1, an ESD protection circuit 5, a crystal oscillator 7, a capacitor C1, and a capacitor C2.

The ESD protection circuit 3 is disposed between the input terminal 1 and the input end of the CMOS inverter 4. The ESD protection circuit 3 includes: a p-channel MOS transistor P1 having a gate end and a source end connected to a high potential side power supply VDD, and a drain end connected to the input end of the CMOS inverter 4; and an n-channel MOS transistor N1 having a gate end and a source end connected to a low potential side power supply VSS, and a drain end connected to the input end of the CMOS inverter 4. Likewise, the ESD protection circuit 5 is disposed between the output terminal 2 and the output end of the CMOS inverter 4. The ESD protection circuit 5 includes: a p-channel MOS transistor P2 having a gate end and a source end connected to the high potential side power supply VDD, and a drain end connected to an output end of the CMOS inverter 4; and an n-channel MOS transistor N2 having a gate end and a source end connected to the low potential side power supply VSS, and a drain end connected to the output end of the CMOS inverter 4.

In this case, the crystal oscillator 7 is disposed in the external portion of the semiconductor integrated circuit chip, and connected between the input terminal 1 and the output terminal 2. Also, the capacitor C1 is connected between the input terminal 1 and the low potential side power supply VSS, and the capacitor C2 is connected between the output terminal 2 and the low potential side power supply VSS. Further, the input end of the CMOS inverter 4 is connected to the input terminal 1, and the output end of the CMOS inverter 4 is connected to the output terminal 2. Also, the feedback resistor R1 is connected between the input end and the output end of the CMOS inverter 4.

With the above-mentioned configuration, an oscillation signal obtained from the output end of the CMOS inverter 4 is given to another circuit (not shown) as a clock signal.

In this case, with the connection of the feedback resistor R1 to the CMOS inverter 4, the CMOS inverter 4 functions as an inverter amplifier. FIG. 7 is a diagram showing an input/output characteristic of the inverter amplifier. An operating point bias voltage at the input end of the CMOS inverter 4 is stable at a point (point A) of a threshold voltage of the CMOS inverter 4 where the gain (output voltage variation/input voltage variation) as the inverter amplifier becomes maximum, and an oscillation starts at a resonant frequency of the crystal oscillator 7 by the gain of the inverter amplifier and the phase adjustment due to the capacitor C1 and the capacitor C2.

However, when the supply voltage drops along with manufacturing process becoming finer, a threshold voltage of the MOS transistor is also decreased. As a result, a leakage current occurs in a source-drain path of the MOS transistor that is normally off. Further, in the case where an ambient temperature increases, the leakage current exponentially increases with respect to an increase in the temperature. Also, the leakage currents of the n-channel MOS transistor and the p-channel transistor are not always equal to each other depending on the manufacturing process. In this case, there is a strong possibility that a problem is caused in the circuit operation depending on the circuit configuration of the above-mentioned oscillator circuit. For example, in the ESD protection circuit 3 of FIG. 6, in the case where the leakage current of the p-channel transistor P1 is larger than the leakage current of the n-channel MOS transistor N1 (for example, twice or more), the leakage current of the p-channel transistor P1 flows in the feedback resistor R1 side because an input impedance of the CMOS inverter 4 is extremely high. Accordingly, the operating point bias voltage at the input end of the CMOS inverter 4 is deviated by the voltage drop that is developed at both ends of the feed resistor R1, thereby deteriorating the duty ratio of a waveform that is output from the oscillator circuit. Further, because the leakage current exponentially increases with respect to an increase in temperature, the voltage fluctuates up to a point (point B of FIG. 7) at an end of a dynamic range as the inverter amplifier at the time of a high temperature, and the gain becomes 1 or lower to stop the oscillation. JP 2003-133855 A discloses a temperature compensation circuit having an output end that is connected to an input end of an input circuit so as to make a voltage at the input end of the input circuit equal to a reference voltage in order to suppress a variation in the operating point bias voltage due to the leakage current.

SUMMARY OF THE INVENTION

The present invention seeks to solve one or more of the above problems, or to improve upon those problems at least in part.

In one embodiment, a semiconductor device comprises an internal circuit, a protection circuit which includes a protection transistor connected to an input terminal of the internal circuit and an adjustor circuit connected to the input terminal in series with the protection transistor, and a control circuit which includes a monitor circuit having a circuit configuration equivalent to a circuit configuration of the protection circuit. The control circuit provides a control signal for both adjustor circuits in protection circuit and monitor circuit so that each of adjustor circuits represents a impedance to cancel each of leakage current of the protection transistors in the protection circuit and the monitor circuit.

That is, the impedance of the adjustor circuits is controlled to make the leakage current of the protective transistor flow in the adjustor circuit under control. This makes it possible to suppress an influence of the leakage current of the protective transistor on the operation of other circuits that constitute a semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, a description will be given in more detail of a first embodiment of the present invention with reference to the accompanying drawings. In the first embodiment of the present invention, the present invention is applied to an oscillator circuit of a semiconductor device.

Figure 1:
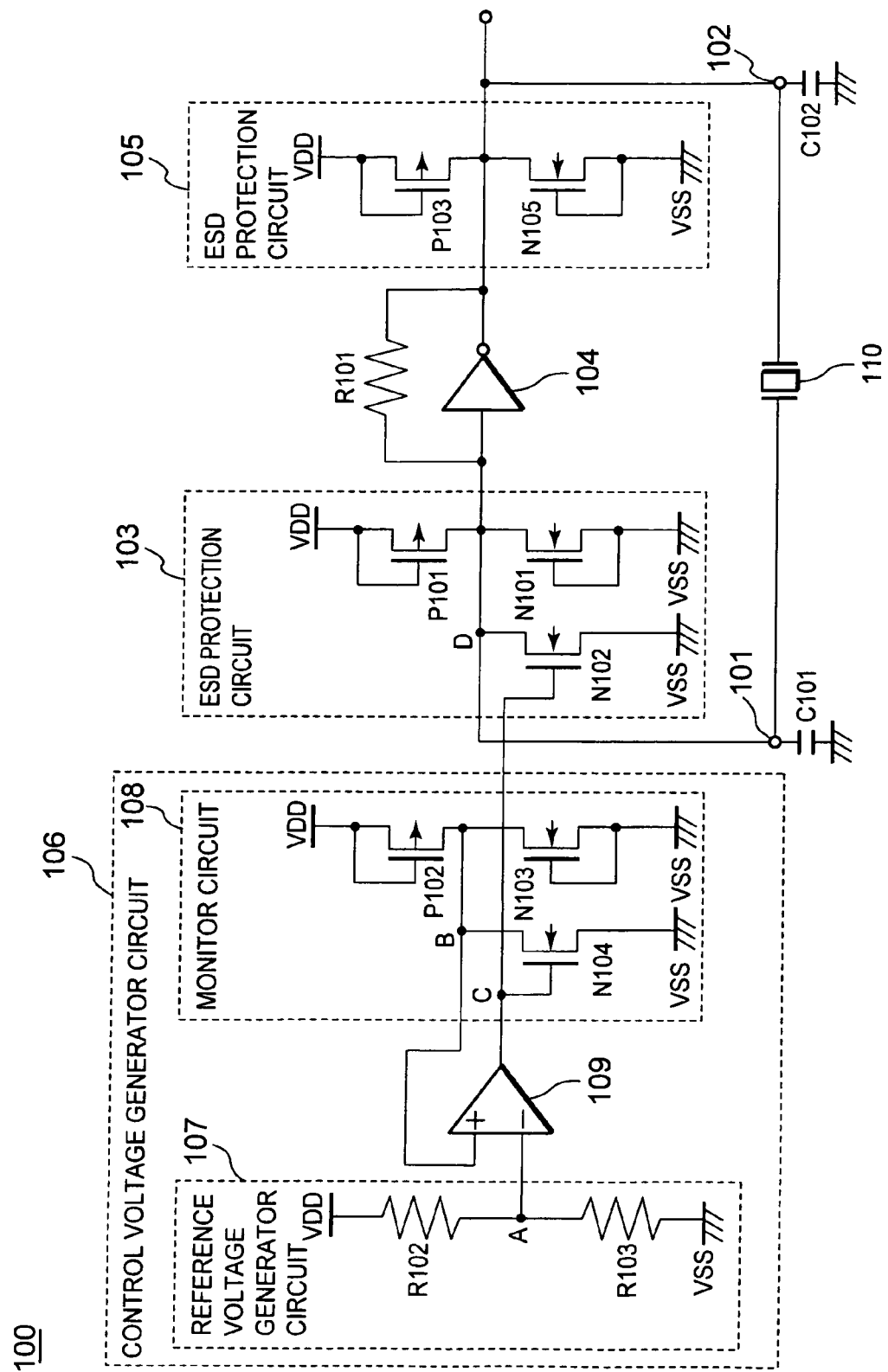
FIG. 1 is a circuit configuration diagram showing a semiconductor device according to a first embodiment of the present invention.

FIG. 1 shows an example of a configuration of an oscillator circuit of a semiconductor device according to this embodiment. In this embodiment, it is assumed that a leakage current twice or more as large as a leakage current of an n-channel MOS transistor is generated in a p-channel MOS transistor within an ESD protection circuit.

An oscillator circuit 100 includes an input terminal 101 and an output terminal 102 which are disposed in a semiconductor integrated circuit chip, an electrostatic protection circuit (hereinafter referred to as "ESD protection circuit") 103, a CMOS inverter 104 and a feedback resistor R101 which have an input end of a high impedance, an ESD protection circuit 105, a control voltage generator circuit 106, a crystal oscillator 110, a capacitor C101, and a capacitor C102. In this case, the input terminal 101, the output terminal 102, the ESD protection circuit 103, the CMOS inverter 104, the feedback resistor R101, the ESD protection circuit 105, and the control voltage generator circuit 106 are disposed on the semiconductor integrated circuit chip. The crystal oscillator 110, the capacitor C101, and the capacitor C102 are disposed out of the semiconductor integrated circuit chip.

The ESD protection circuit 103 includes: a p-channel MOS transistor P101 having a gate end and a source end connected to a high potential side power supply VDD, and a drain end connected to an input end (node D) of the CMOS inverter 104; an n-channel MOS transistor N101 having a gate end and a source end connected to a low potential side power supply VSS, and a drain end connected to the input end (node D) of the CMOS inverter 104; and an n-channel MOS transistor N102 having a gate end connected to an output (node C) from the control voltage generator circuit 106, a source end connected to the low potential side power supply VSS, and a drain end connected to the input end (node D) of the CMOS inverter 104. In this case, the gate width of the n-channel MOS transistor N102 is equal to or lower than 1/10 of the gate width of the p-channel MOS transistor P101 and the n-channel MOS transistor N101. The n-channel MOS transistor N102 functions as an adjustor circuit that adjusts a leakage current that is generated in the p-channel MOS transistor P101 so as to flow in the n-channel MOS transistor N101 and the low potential side power supply VSS.

The ESD protection circuit 105 includes: a p-channel MOS transistor P103 having a gate end and a source end connected to the high potential side power supply VDD, and a drain end connected to an output end of the CMOS inverter 104; and an n-channel MOS transistor N105 having a gate end and a source end connected to the low potential side power supply VSS, and a drain end connected to the output end of the CMOS inverter 104.

The control voltage generator circuit 106 includes a reference voltage generator circuit 107, an operational amplifier 109, and a monitor circuit 108.

Figure 2:
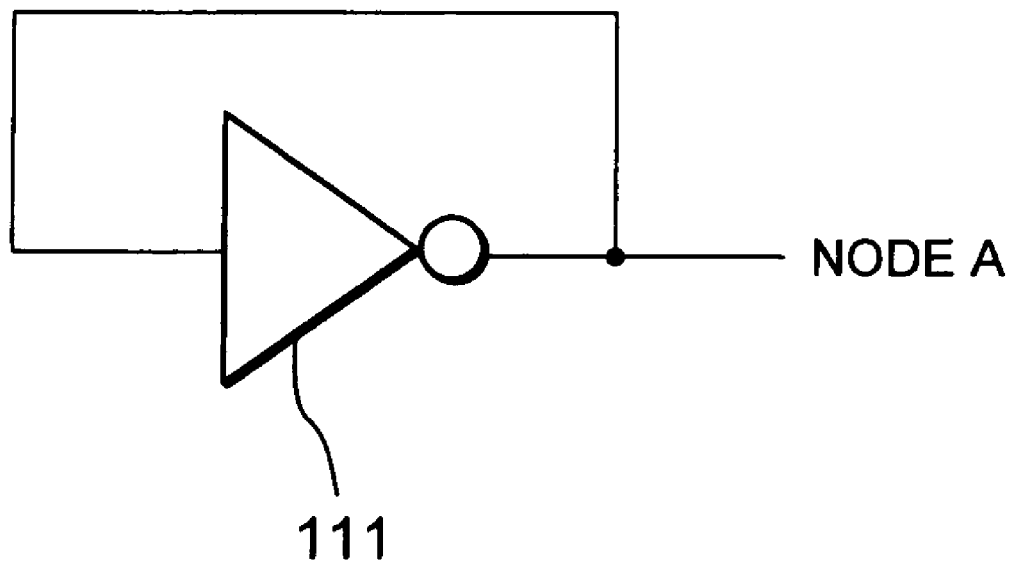
FIG. 2 is another circuit configuration diagram showing a reference voltage generator circuit of FIG. 1.

In this case, the reference voltage generator circuit 107 is made up of a resistor R102 and a resistor R103 which are connected in series between the high potential side power supply VDD and the low potential side power supply VSS. Also, a node A between the resistor R102 and the resistor R103 is connected to an inverting input terminal of the operational amplifier 109. FIG. 2 shows another example of the reference voltage generator circuit. As shown in the figure, an input end and an output end of the CMOS inverter 111 can be connected to each other to generate a reference voltage of VDD/2.

Also, the monitor circuit 108 includes a p-channel MOS transistor P102 having a gate end and a source end connected to the high potential side power supply VDD, and a drain end connected to a non-inverting input terminal (node B) of the operational amplifier 109, an n-channel MOS transistor N103 having a gate end and a source end connected to the lower potential side power supply VSS, and a drain end connected to the non-inverting input terminal (node B) of the operational amplifier 109, and an n-channel MOS transistor N104 having a gate end connected to the output end (node C) of the operational amplifier 109, a source end connected to the low potential side power supply VSS, and a drain end connected to the non-inverting input terminal (node B) of the operational amplifier 109.

In this case, the p-channel MOS transistor P102 of the monitor circuit 108 and the p-channel MOS transistor P101 of the ESD protection circuit 103, the n-channel MOS transistor N103 and the n-channel MOS transistor N101, and the n-channel MOS transistor N104 and the n-channel MOS transistor N102 are formed in the same transistor size, respectively, or formed at least by the same process. In this case, the gate width of the n-channel MOS transistor N104 is equal to or lower than 1/10 of the gate width of the p-channel MOS transistor P102 and the n-channel MOS transistor N103. Note that the monitor circuit 108 and the ESD protection circuit 103 may be partially different in the configuration within a range where the fundamental performance is not affected by the difference.

The crystal oscillator 110 in the exterior of the semiconductor integrated circuit chip is connected between the input terminal 101 and the output terminal 102. Also, the capacitor C101 is connected between the input terminal 101 and the low potential side power supply VSS, and the capacitor C102 is connected between the output terminal 102 and the low potential side power supply VSS. Also, the input end of the CMOS inverter 104 is connected to the input terminal 101, and the output end of the CMOS inverter 104 is connected to the output terminal 102. Further, the feedback resistor R101 is connected between the input end and the output end of the CMOS inverter 104. Further, the ESD protection circuit 103 is connected to the input end of the CMOS inverter 104, and the ESD protection circuit 105 is connected to the output end of the CMOS inverter 104.

Next, a description will be given of the operation of the oscillator circuit of the semiconductor device according to the first embodiment of the present invention. The input terminal 101, the output terminal 102, the CMOS inverter 104, the feedback resistor R101, the ESD protection circuit 105, the crystal oscillator 110, the capacitor C101, and the capacitor C102 are identical in the configuration with the input terminal 1, the output terminal 2, the CMOS inverter 4, the feedback resistor R1, the ESD protection circuit 5, the crystal oscillator 7, the capacitor C1, and the capacitor C2 of the conventional art, and a description of their operation will be omitted because the description has been made in the related art.

Now, there is described a case in which a leakage current is generated from the p-channel MOS transistor P101 in the ESD protection circuit 103. In this case, a leakage current is also generated from the n-channel MOS transistor N101, and it is presumed that a given amount of leakage current that is generated from the p-channel MOS transistor P101 flows in the n-channel MOS transistor P101. Assuming that the leakage current that is generated from the p-channel MOS transistor P101 is about twice or more as large as the leakage current that flows in the n-channel MOS transistor N101, the operation of the oscillator circuit of the semiconductor device according to the first embodiment of the present invention will be considered.

First, in the case where the leakage current is generated from the p-channel MOS transistor P101 of the ESD protection circuit 103 as described above, the leakage current is similarly generated from the p-channel MOS transistor P102 of the monitor circuit 108 having the same transistor configuration. Hence, a potential of the node B increases, and the potential is input to the non-inverting input terminal of the operational amplifier 109. On the other hand, the non-inverting input terminal of the operational amplifier 109 is input with a potential (VDD/2) of the node A which is generated by the resistors R102 and R103 within the reference voltage generator circuit 107. Hence, to the node C that is an output end of the operational amplifier 109, a potential corresponding to a potential difference between the node A and the node B is output. For example, when the potential of the node B is higher than the potential of the node A, a higher potential is output from the operational amplifier 109, and the gate of the n-channel MOS transistor N104 whose gate end is connected to the node C opens according to the potential. Accordingly, the leakage current from the p-channel MOS transistor P102 flows in the low potential side power supply VSS through the n-channel MOS transistor N104, and the potential of the node B decreases. The operation continues until the potential of the node B becomes equal to the potential (VDD/2) of the node A. In this way, in the control voltage generator circuit 106, the operational amplifier 109 is subjected to feedback through the n-channel MOS transistor N104. Hence, the operational amplifier 109 controls the impedance of the transit path of the leakage current due to the n-channel MOS transistor N104 so that the leakage current from the p-channel MOS transistor P102 becomes equal to the total current that flows in the n-channel MOS transistor N104 and the n-channel MOS transistor N103. As a result, the potential of the node B is controlled so as to consort with the potential (VDD/2) of the node A.

On the other hand, the potential of the node C is also connected to the gate of the n-channel MOS transistor N102 within the ESD protection circuit 103. Hence, the potential of the node C which is controlled by the control voltage generator circuit 106 as described above is input to the gate of the n-channel MOS transistor N102. That is, the impedance of the transit path of the leakage current due to the n-channel MOS transistor N102 that constitutes the adjustor circuit is also controlled. In this case, the transistor size of the transistors that constitute the monitor circuit 108 is the same as the transistor size of the transistors that constitute the ESD protection circuit 103 as described above. For that reason, the potential of the node D also becomes the same potential (VDD/2) as the potential of the node B.

Hence, the leakage current from the p-channel MOS transistor P101 of the ESD protection circuit 103 is adjusted so as to be inhaled by the n-channel MOS transistors N101 and N102 by the potential of the node C which is controlled by the operational amplifier 109 of the control voltage generator circuit 106, whereby no current flows in the feedback resistor R101 of the CMOS inverter 104. As a result, an auto-bias voltage does not stray. Also, the leakage current of the protection transistor is indirectly monitored by the monitor circuit, and the gate voltage of the n-channel MOS transistor N102 is applied. Therefore, the oscillating operation of the oscillator circuit is not affected. As a result, the duty ratio of the waveform which is output from the oscillator circuit can be prevented from being deteriorated, and the oscillation stop does not occur.

In the example of the operation of the first embodiment of the present invention, the operation of the ESD protection circuit 105 that is connected to the output terminal 102 is not described. This is because the leakage current from the p-channel MOS transistor P103 of the ESD protection circuit 105 does not flow in the feedback resistor R101 side because the output impedance of the CMOS inverter 104 is small, which causes no problem.

Hereinafter, a specific second embodiment of the present invention, to which the present invention is applied, will be described in detail with reference to the accompanying drawings. In the second embodiment, the present invention is applied to the oscillator circuit of the semiconductor device as in the first embodiment of the present invention.

Figure 3:
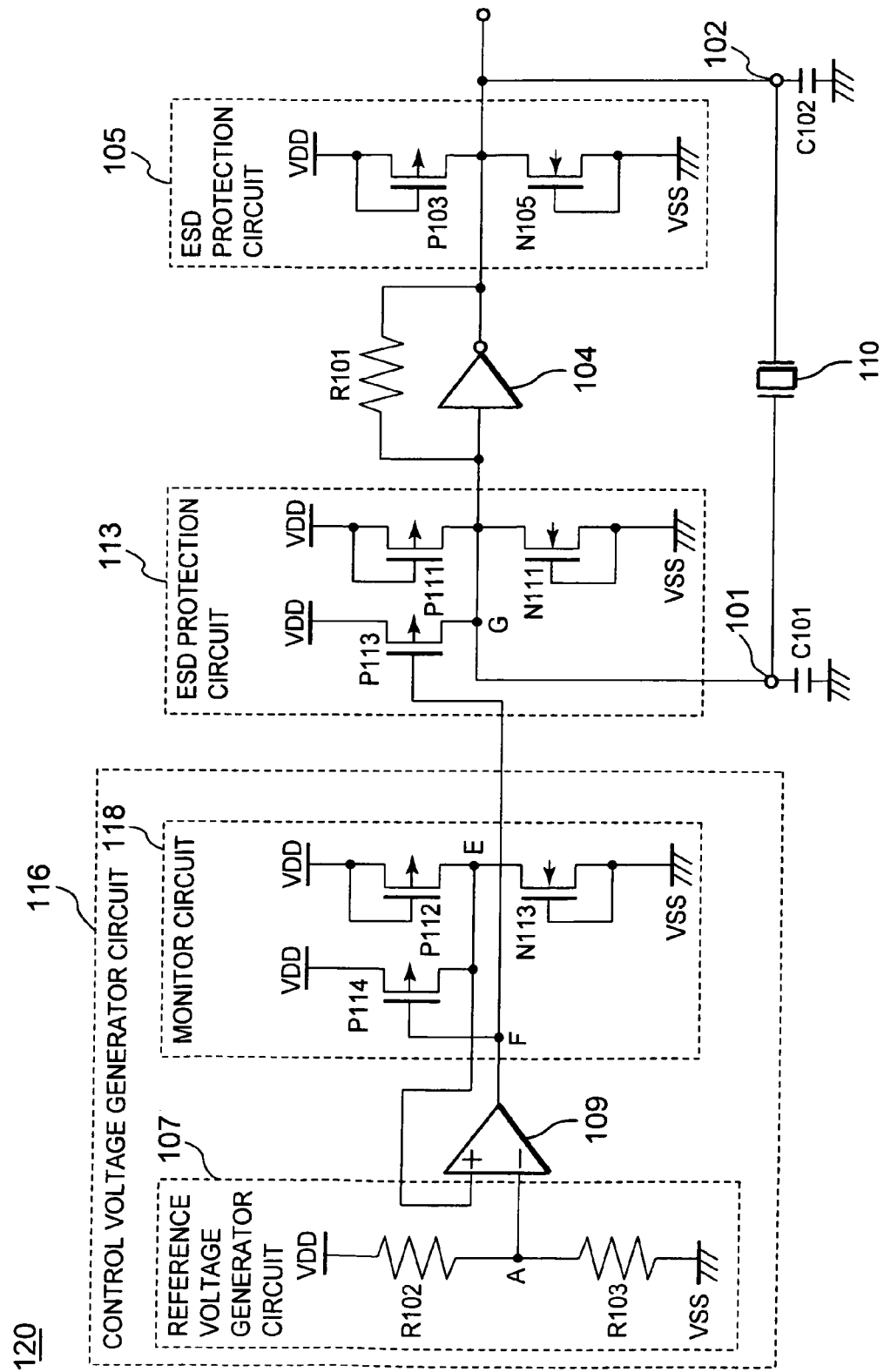
FIG. 3 is a circuit configuration diagram showing a semiconductor device according to a second embodiment of the present invention.

FIG. 3 shows an example of the configuration of the oscillator circuit 120 of the semiconductor device according to the second embodiment of the present invention. In the second embodiment of the present invention, it is assumed that a leakage current occurs in the n-channel MOS transistor within the ESD protection circuit. Of symbols shown in the figure, the configurations indicated by the same symbols as the symbols of FIG. 1 represent the configurations identical with or similar to the symbols of FIG. 1. A difference from the first embodiment of the present invention resides in the configuration of the ESD protection circuit and the monitor circuit at the input side of the CMOS inverter 104. Hence, in the second embodiment of the present invention, only the different configuration will be described.

As shown in FIG. 3, an ESD protection circuit 113 includes a p-channel MOS transistor P111, an n-channel MOS transistor N111, and a p-channel MOS transistor P113. The p-channel MOS transistor P111 has a gate end and a source end connected to the high potential side power supply VDD, and a drain end connected to an input end (node G) of the CMOS inverter 104. The n-channel MOS transistor N111 has a gate end and a source end connected to the lower potential side power supply VSS, and a drain connected to the input end (node G) of the CMOS inverter 104. The p-channel MOS transistor P113 has a gate end connected to an output (node F) from a control voltage generator circuit 116, a source end connected to the high potential side power supply VDD, and a drain end connected to the input terminal (node G) of the CMOS inverter 104. Also in this case, the gate width of the p-channel MOS transistor P113 is equal to or lower than 1/10 of the gate width of the p-channel MOS transistor P111 and the n-channel MOS transistor N111.

A monitor circuit 118 includes a p-channel MOS transistor P112, an n-channel MOS transistor N113, and a p-channel MOS transistor P114. The P-channel MOS transistor P112 has a gate end and a source end connected to the high potential side power supply VDD, and a drain end connected to a non-inverting input terminal (node E) of the operational amplifier 109. The n-channel MOS transistor N113 has a gate end and a source end connected to the low potential side power supply VSS, and a drain end connected to the non-inverting input terminal (node E) of the operational amplifier 109. The p-channel MOS transistor P114 has a gate end connected to the output end (node F) of the operational amplifier 109, a source end connected to the high potential side power supply VDD, and a drain end connected to the non-inverting input terminal (node E) of the operational amplifier 109.

In this case, the p-channel MOS transistor P112 of the monitor circuit 118 and the p-channel MOS transistor P111 of the ESD protection circuit 113, the n-channel MOS transistor N113 of the monitor circuit 118 and the n-channel MOS transistor N111 of the ESD protection circuit 113, and the p-channel MOS transistor P114 of the monitor circuit 118 and the p-channel MOS transistor P113 of the ESD protection circuit 113 are formed in the same transistor size, respectively. In this case, the gate width of the p-channel MOS transistor P114 is equal to or lower than 1/10 of the gate width of the p-channel MOS transistor P112 and the n-channel MOS transistor N113. The ESD protection circuit 113 and the control voltage generator circuit 116 are formed on the semiconductor integrated circuit chip.

Next, a description will be given of the operation of the oscillator circuit of the semiconductor device according to the second embodiment of the present invention. A difference from the first embodiment of the present invention resides in the configurations of the ESD protection circuit 113 and the monitor circuit 118 of the control signal generator circuit 116, and therefore only the different portions will be described.

First, a case in which a leakage current is generated from the n-channel MOS transistor N111 in the ESD protection circuit 113 is considered. However, a leakage current is also generated from the p-channel MOS transistor P111, and it is presumed that a given amount of leakage current that is generated from the n-channel MOS transistor N111 flows from the p-channel MOS transistor P111. Assuming that the leakage current that flows in the n-channel MOS transistor N111 is about twice or more as large as the leakage current from the p-channel MOS transistor P111, the operation of the oscillator circuit of the semiconductor device according to the second embodiment of the present invention will be considered.

First, in the case where the leakage current is generated from the n-channel MOS transistor N111 of the ESD protection circuit 113 as described above, the leakage current is similarly generated in the n-channel MOS transistor N113 of the monitor circuit 118 having the same transistor configuration. Hence, a potential of the node E drops, and the potential is input to the non-inverting input terminal of the operational amplifier 109. On the other hand, the non-inverting input terminal of the operational amplifier 109 is input with the potential (VDD/2) of the node A which is generated by the resistors R102 and R103 within the reference voltage generator circuit 107. Hence, to the node F that is an output end of the operational amplifier 109, a potential corresponding to a potential difference between the node A and the node E is output. For example, when the potential of the node E is lower than the potential of the node A, a lower potential is output from the operational amplifier 109, and the gate of the p-channel MOS transistor P114 whose gate end is connected to the node F opens according to the potential. Accordingly, the leakage current generated in the n-channel MOS transistor N113 flows from the high potential side power supply VDD through the p-channel MOS transistor P114, and the potential of the node E increases. This operation is conducted until the potential of the node E becomes finally equal to the potential (VDD/2) of the node A. In this way, in the control voltage generator circuit 116, the operational amplifier 109 is subjected to feedback through the p-channel MOS transistor P114. Hence, the operational amplifier 109 controls the impedance of the transit path of the leakage current due to the p-channel MOS transistor P114 so that the leakage current from the n-channel MOS transistor N113 becomes equal to the total current that flows from the p-channel MOS transistor P114 and the p-channel MOS transistor P112. As a result, the potential of the node E is controlled so as to consort with the potential (VDD/2) of the node A.

On the other hand, the potential of the node F is also connected to the gate of the p-channel MOS transistor P113 within the ESD protection circuit 113. Hence, the potential of the node F which is controlled by the control voltage generator circuit 116 as described above is input to the gate of the p-channel MOS transistor P113. That is, the impedance of the transit path of the leakage current due to the p-channel MOS transistor P114 that constitutes the adjustor circuit is also controlled. In this case, as described above, the transistor size of the transistors that constitute the monitor circuit 118 is the same as the transistor size of the transistors that constitute the ESD protection circuit 113. For that reason, the potential of the node G also becomes the same potential (VDD/2) as the potential of the node E.

Hence, the leakage current that occurs due to the n-channel MOS transistor N111 of the ESD protection circuit 113 is supplied by the p-channel MOS transistor P111 and the p-channel MOS transistor P113, owing to the potential of the node F that is controlled by the operational amplifier 109 of the control voltage generator circuit 116, so that no current flows from the feedback resistor R101 of the CMOS inverter 104, with the result that the auto-bias voltage does not stray. As a result, the duty ratio of the waveform which is output from the oscillator circuit can be prevented from being deteriorated, and the oscillation stop does not occur.

Figure 4:
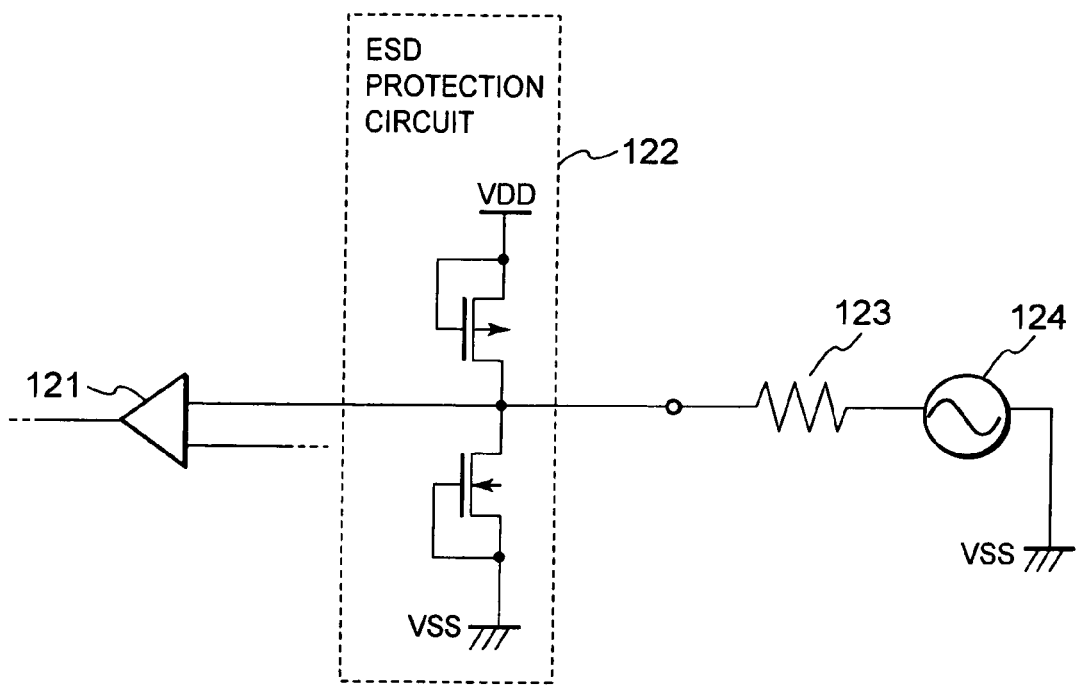
FIG. 4 is a circuit configuration diagram for explaining another internal circuit.
Figure 5:
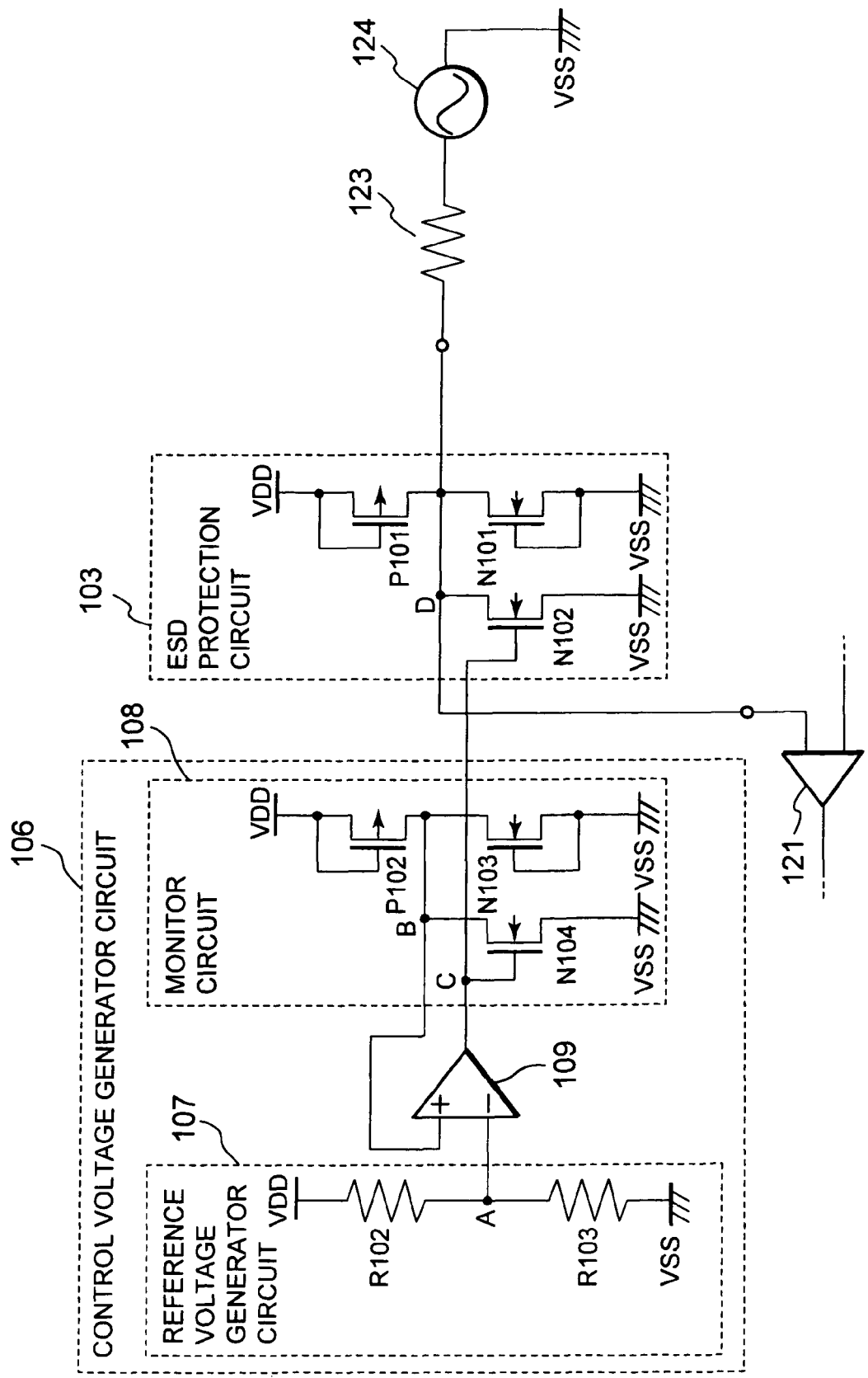
FIG. 5 is a circuit configuration diagram showing a semiconductor device in the case where the present invention is applied to the internal circuit of FIG. 4.
Figure 6:
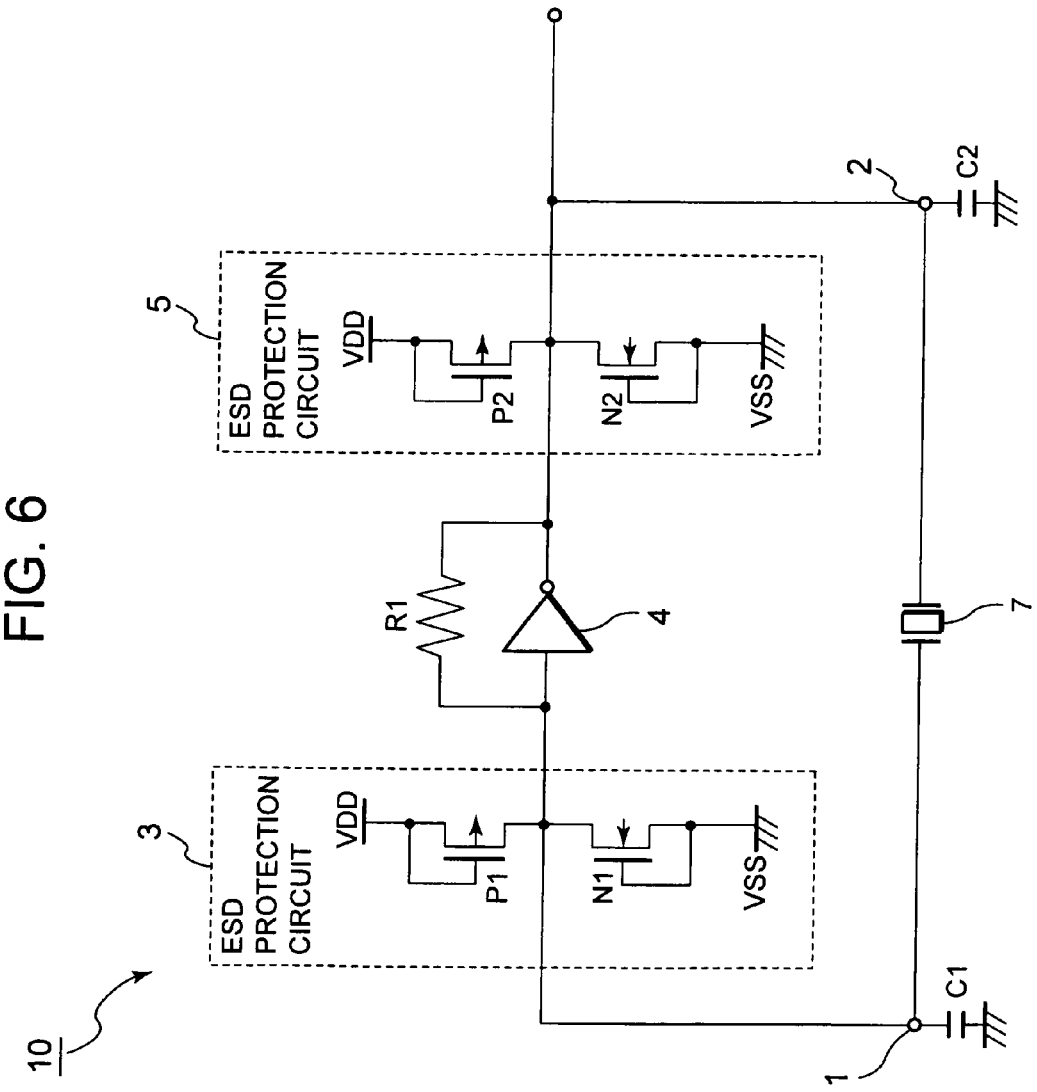
FIG. 6 is a diagram showing an example of the configuration of a conventional semiconductor device.
Figure 7:
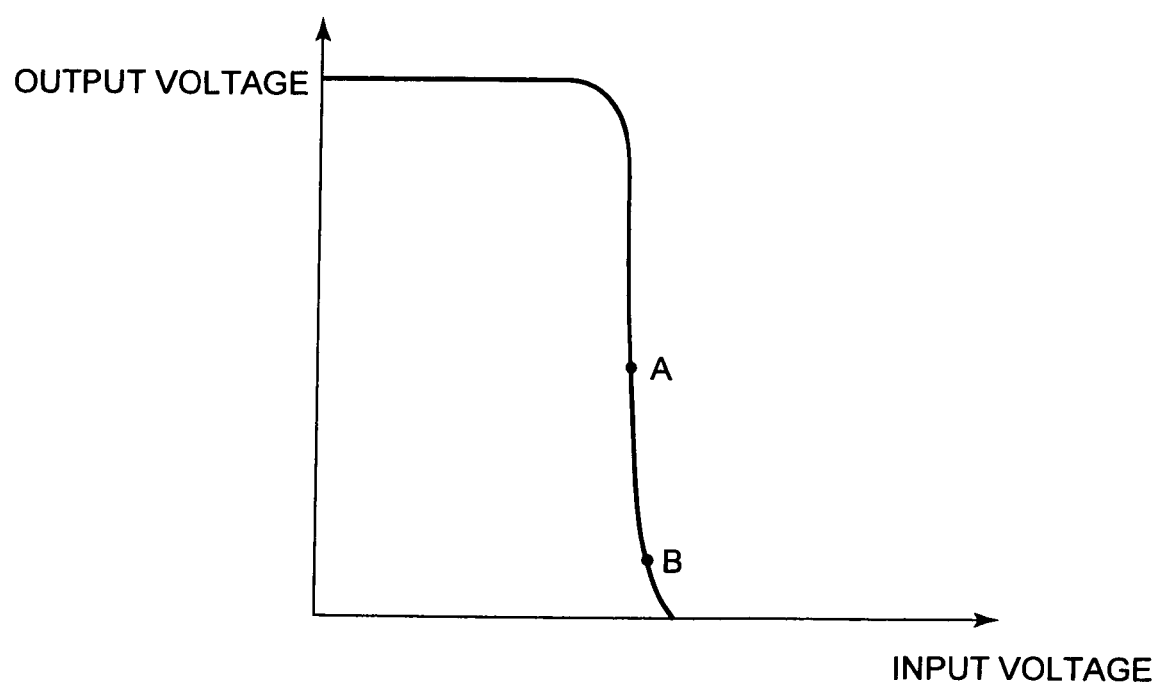
FIG. 7 is a diagram showing an input/output characteristic of an inverter amplifier of FIG. 6.

The present invention is not limited to the above embodiment, but various changes may be made without departing from the scope of the invention. The present invention is effective in the diverse devices that suffer from a problem on the leakage current of the ESD protection circuit. For example, a case of using the ESD protection circuit 122 at the input stage of the operational amplifier 121 as shown in FIG. 4 is considered. In this case, when it is assumed that the leakage current from the p-channel MOS transistor occurs as in the first embodiment of the present invention, the leakage current flows in the signal source side, and a voltage drop caused by the impedance 123 of the signal source 124 may become a problem. In this case, as shown in FIG. 5, the leakage current of the p-channel MOS transistor can be controlled by using the present invention (semiconductor device of the first embodiment of this example), thereby obtaining an effect that a signal that is input to the operational amplifier 121 is not adversely affected. Further, in the above example, the adjustor circuit that adjusts the leakage current is constituted by the n-channel MOS transistor N102, but can be constituted by a plurality of transistors.

It is apparent that the present invention is not limited to the above embodiments, but may be modified and changed without departing from the scope and spirit of the invention.

What is claimed is:

1. A semiconductor device, comprising:
   an internal circuit;
   a protection circuit including a first protection transistor connected to an input terminal of said internal circuit and a first adjustor circuit connected to said input terminal in series with said first protection transistor;
   a control circuit including, a monitor circuit having a second protection transistor and a second adjustor circuit connected in series with said second protection transistor, said control circuit providing a control signal for both said first and second adjustor circuits so that each of said first and second adjustor circuits represents a impedance to cancel each of leakage current of said first and second protection transistors.

2. The semiconductor device according to claim 1, wherein said control circuit generates said control signal so that a potential of a joint of said second protection transistor and said second adjustor circuit keeps a reference voltage.

3. The semiconductor device according to claim 1, wherein said first adjustor circuit includes a first compensation transistor connected in series with said first protection transistor, said second adjustor circuit includes a second compensation transistor connected in series with a second protection transistor and said control circuit provides said control signal with gate electrodes of said first and second protection transistors.

4. The semiconductor device according to claim 3, wherein said first and second protection transistors are first conductivity type, said first and second compensation transistors are second conductivity type which is different from said first conductivity type.

5. The semiconductor device according to claim 4, wherein said protection circuit further includes a third protection transistor connected in series with said first protection transistor, said monitor circuit further includes a fourth transistor connected in series with said second protection transistor, and said third and fourth protection transistor are said second conductivity type.

6. The semiconductor device according to claim 5, wherein said first compensation transistor has a first gate width that is ⅒ or lower of a gate width of said third protection transistor and said second compensation transistor has said first gate width.

7. The semiconductor device according to claim 2, wherein said control circuit further includes:
   a reference voltage generating circuit generating said reference voltage; and
   an operational amplifier comparing a potential of said joint of said second protection circuit and said second adjustor circuit with said reference voltage.

8. The semiconductor device according to claim 3, wherein said first and second protection transistors have the same transistor size, and said first and second compensation transistors have the Same transistor size.

9. The semiconductor device according to claim 2, said reference voltage comprises an intermediate voltage between a first power supply voltage and a second power supply voltage.

10. The semiconductor device according to claim 1, wherein said internal circuit includes an oscillator circuit.

11. The semiconductor device according to claim 1, wherein said internal circuit includes an operational amplifier.

* * * * *